(12) United States Patent
Erdemir et al.

(10) Patent No.: US 7,211,323 B2
(45) Date of Patent: May 1, 2007

(54) HARD AND LOW FRICTION NITRIDE COATINGS AND METHODS FOR FORMING THE SAME

(75) Inventors: Ali Erdemir, Naperville, IL (US); Mustafa Ürgen, Istanbul (TR); Ali Fuat Cakir, Istanbul (TR); Osman Levent Eryilmaz, Bolingbrook, IL (US); Kursat Kazmanli, Istanbul (TR); Ozgul Keles, Istanbul (TR)

(73) Assignee: U Chicago Argonne LLC, Chicago, IL (US)

(*) Notice: Subject to any disclaimer, the term of this patent is extended or adjusted under 35 U.S.C. 154(b) by 0 days.

(21) Appl. No.: 10/337,966

(22) Filed: Jan. 6, 2003

(65) Prior Publication Data
US 2004/0131894 A1 Jul. 8, 2004

(51) Int. Cl.
*B32B 5/16* (2006.01)
*C22C 29/16* (2006.01)

(52) U.S. Cl. .................. 428/323; 428/698; 428/704; 106/287.3; 75/244

(58) Field of Classification Search ............... 428/698, 428/565, 569, 323, 704; 106/287.3; 75/244
See application file for complete search history.

(56) References Cited

U.S. PATENT DOCUMENTS 3,941,903 A * 3/1976 Tucker, Jr. .................. 427/451
4,334,926 A * 6/1982 Futamura et al. ............. 75/230
5,185,216 A * 2/1993 Tanaka et al. ............... 428/614
5,540,750 A * 7/1996 Fernandez et al. ............ 75/235
6,126,710 A * 10/2000 Futterer ....................... 75/246

FOREIGN PATENT DOCUMENTS

DE       19520614     * 7/1996
EP        0174019     * 2/1986

OTHER PUBLICATIONS

Sproul. Reactively sputtered doped hafnium nitride coatings, Surface and Coatings Technology, vol. 36, Issues 1-2, Dec. 1988.*
"A perspective of magnetron sputtering in surface engineering," Surface & Coatings Technology 112, Elsevier Science S.A., J. Musil et al., dated 1999, pp. 162-169.
"Characterizations of super hard Cu films containing insoluble W prepared by sputter deposition," Materials Chemistry and Physics 72, Elsevier Science B.V., J.P. Chu et al., dated 2001, pp. 286-289.

(Continued)

*Primary Examiner*—Jennifer McNeil
*Assistant Examiner*—G. Blackwell
(74) *Attorney, Agent, or Firm*—Foley & Lardner, LLP (57) ABSTRACT

An improved coating material possessing super-hard and low friction properties and a method for forming the same. The improved coating material includes the use of a noble metal or soft metal homogeneously distributed within a hard nitride material. The addition of small amounts of such metals into nitrides such as molybdenum nitride, titanium nitride, and chromium nitride results in as much as increasing of the hardness of the material as well as decreasing the friction coefficient and increasing the oxidation resistance.

12 Claims, 10 Drawing Sheets

OTHER PUBLICATIONS

"Hard and superhard nanocomposite Al-Cu-N films prepare d by magnetron sputtering," Surface & Coatings Technology 142-144, *Elsevier Science B.V.*, J. Musil et al., dated 2001, pp. 603-609.

"Hard and superhard Zr-Ni-N nanocomposite films," Surface & Coatings Technology 139, *Elsevier Science B.V.*, J. Musil et al., Jan. 2, 2001, pp. 101-109.

"Hard nanocomposite Zr-Y-N coatings, correlation between hardness and structure," Surface & Coatings Technology 127, *Elsevier Science S.A.*, Feb. 21, 2000; pp. 99-106.

"Magnetron sputtering of hard nanocomposite coatings and their properties," Surface & Coatings Technology 142-144, *Elsevier Science B.V.*, J. Musil et al., dated 2001; pp. 557-566.

"Nanocrystalline and nanocomposite CrCu and CrCu-N films prepared by magnetron sputtering," Surface & Coatings Technology 115, *Elsevier Science S.A.*, J. Musil et al., Feb. 25, 1999; pp. 32-37.

"Structure and properties of hard and superhard Zr-Cu-N nanocomposite coatings," Materials Science & Engineering A289, *Elsevier Science S.A.*, P. Zeman et al., Mar. 6, 2000, pp. 189-197.

"Structure refinement and hardness enhancement of titanium nitride films by addition of copper," Surface & Coatings Technology 137, *Elsevier Science B.V.*, J.L. He et al., Sep. 29, 2000; pp. 38-42.

"ZrN/Cu nanocomposite film—a novel superhard material," Surface & Coatings Technology 120-121, *Elsevier Science S.A.*, J. Musil et al.; dated 1999; pp. 179-183.

"Structure and Microhardness of magnetron sputtered ZrCu and ZrCu-N films," Surface Engineering, Surface Instrumentation & Vacuum Technology 52, *Elsevier Science Ltd.*, Jun. 17, 1998; pp. 269-275.

* cited by examiner

HARD AND LOW FRICTION NITRIDE COATINGS AND METHODS FOR FORMING THE SAME

This invention was made with government support under Contract No. W-31-109-ENG-38 awarded to the Department of Energy. The Government has certain rights in this invention.

FIELD OF THE INVENTION

The present invention relates to coating materials with low-friction properties. More particularly, the present invention relates to nitride coatings, which possess low friction and improved wear properties under boundary lubricated sliding conditions.

BACKGROUND OF THE INVENTION

From a tribological standpoint, a combination of high mechanical hardness with low friction is always desired but seldom achieved in most sliding surfaces. With many conventional coatings, base steel sliding against itself gives friction coefficients of 0.12 to 0.16 even under the best lubrication conditions.

Alloying ingredients used in certain coatings are inherently soft and therefore possess fairly good solid lubrication properties. Metals such as copper, tin, antimony, cadmium and zinc show good lubrication properties under oil lubricated sliding conditions as well. Specifically, these metals primarily undergo easy shear under loaded sliding contacts due to their softness. In one set of sliding experiments with pure metals under lubricated conditions, pure copper, bismuth, antimony, tin, and zinc were considered. All of the metals except bismuth resulted in a low friction coefficient, confirming that the respective metals were lubricious under lubricated sliding conditions. Additionally, some of the aforementioned metals, such as zinc, possess a good ability to react with the additives in lubricants to form chemical boundary films on sliding surfaces. These chemical films may also possess some lubrication or anti-friction properties. However, soft metals and their films have typically not been used as structural materials for lubricated applications under severe loading conditions, primarily due to their poor mechanical properties and rapid wear.

For all of these reasons, it would be desirable to develop a new and improved coating that possess an improved degree of hardness relative to conventional coatings while also possessing improved lubrication properties.

SUMMARY OF THE INVENTION

It is therefore an object of the invention to provide an improved coating material that possesses a substantially increased hardness relative to conventional soft coatings.

It is another object of the invention to provide an improved coating materials which possesses extremely low friction properties relative to conventional hard coatings.

It is an additional object of the invention to provide an improved coating materials with improved wear properties under boundary lubricated sliding conditions.

In accordance with the above objects, an improved coating material is based on the use of a noble and soft metals such as Au, or a soft metal such as Cu, In, Sn, Sb, Ga and Bi, with hard nitrides, carbonitrides, and borides such as MoN, CrN, TiN, TiCN, TiB2 and ZrN. The addition of small amounts of these metals into MoN, CrN and TiN results in an increase of the hardness of the nitride coatings, in addition to improving the lubricity of these coatings. In particular, it has been found that concentrations of about 1–3 at % of the materials described herein provide for substantial increases in lubricity of the nitride coatings.

BRIEF DESCRIPTION OF THE DRAWINGS

FIG. 2($a$) is a three dimensional image showing the wear damage on a pin surface after a twenty hour test of a TiN coating in base synthetic oil; and FIG. 2($b$) is a three dimensional image showing a disk surface with a TiN coating after the same twenty hour test in a base synthetic oil;

FIG. 10($a$) is a first image of a steel disk after a test in EGR contaminated oil with 0.5% $H_2SO_4$; FIG. 10($b$) is a second image of a steel disk after a test in EGR contaminated oil with 0.5% $H_2SO_4$; and FIG. 10($c$) is a third image of a steel disk after a test in EGR contaminated oil with 0.5% $H_2SO_4$.

DETAILED DESCRIPTION OF THE PREFERRED EMBODIMENTS

The present invention comprises a class of improved nano-composite nitride coatings that are hard and at the same time possess super lubricious properties providing friction coefficients of 0.02–0.05 under marginally lubricated test conditions. Without the coating, base steel sliding against itself gives friction coefficients of 0.12 to 0.16 even under the best lubrication conditions. The coating of the present invention therefore possess both substantially improved hardness and improved lubricity relative to conventional coatings.

The present invention incorporates the use of noble metals and soft metals such as Sn, Sb, Ag, and In, that do not react with hard nitrides such as MoN, CrN, TiN, and ZrN. It was initially believed that the addition of such metals into these nitrides might improve the lubricity of the coatings at high temperatures by providing improved shear qualities, in the case of Au, and by forming lubricious oxides in the case of Sn, In, and Sb.

However, mechanical characterization of composite coatings has revealed that the addition of small amounts Sn, Sb, and In, into MoN, CrN, and TiN coatings during physical vapor deposition results in significant increases-of the hardness of these coatings while also increasing the oxidation resistance of the coatings in some instances. For example, the hardness of these coatings has been found to increase from 2000–3000 kg/mm$^2$ to more than 4500 kg/mm$^2$. Both X-rays and TEM studies have revealed that most nitride coatings underwent an unusual transformation in their grain morphology. Specifically, the grain morphology of nitride coatings changed from an open columnar morphology to a dense equiaxed morphology composed of very small nanocrystalline grains typically ranging in size from 10 to 50 nm.

The coating material according to the present invention comprises a transition metal nitride, carbonitride, carbide and boride containing from about 0.2 to 20.0 wt/% of a "soft" metal, such as Bi, In, Sb and Au. Compared with other hard materials, such as transition metal carbides, nitrides and borides, coatings according to the present invention are substantially harder.

Mechanically, such an apparent change in morphology translates into increase of the hardness, while tribologically the films become extremely wear resistant and superlubricious, providing friction coefficients of 0.02–0.05 when tested in a fully formulated motor oil. These are very low friction values for a boundary lubrication regime (during which direct metal-to-metal contact prevails) relative to conventional coatings. Small amounts of metallic additives, such as Au, Sn, Sb, In, used in the coatings have a dramatic synergistic and/or catalytic effect on friction under oil lubricated sliding conditions. Specifically, the inclusion of the above metallic additives facilitate the formation of a super-slippery boundary film that is responsible for such a reduction in friction. Such a film is not a temporary or transitory entity. Instead, the film is replenished continuously through chemical reactions with additives in lubricating oils.

In one test, the test coatings were deposited using conventional physical vapor deposition (PVD). Vapor deposition techniques allow for the easy integration or incorporation of soft metals into the hard nitride phase. Co-deposition of the hard phase and the soft phase is possible through varying physical vapor deposition techniques. The coatings can be deposited on low-medium or high alloyed steels and cast iron or aluminum alloy substrates at moderate temperatures, for example in the range of about 100–550° C., and at high growth rates using conventional cathodic arc discharge, ion-plating, sputter ion-plating, unbalanced magnetron sputtering and laser ablation methods. Preferably, the method provides an intense plasma discharge sufficient to form nano-sized nitrides.

In one set of tests, the friction values under dry, unlubricated sliding conditions in open air were in the range of 0.2 to 0.4, which is very low for dry sliding. In comparison purposes, steel sliding against steel had a friction coefficient of 0.8 under the same sliding conditions and suffered severe wear. The wear rates of the improved coatings are hard to measure even after sliding for more than a week. The bulk of these coatings is made of transition metal nitrides, but they contain very small amounts of soft metals.

Research has verified that these coatings are nano-crystalline. The grains (typically between 10 and 100 nm) are made of hard nitrides, but the grain boundaries consist of a few atomic layers of Au, Sb, Sn, and In. The total atomic concentrations of these grain boundary metals are between 0.2 and 25%.

Figure 1:
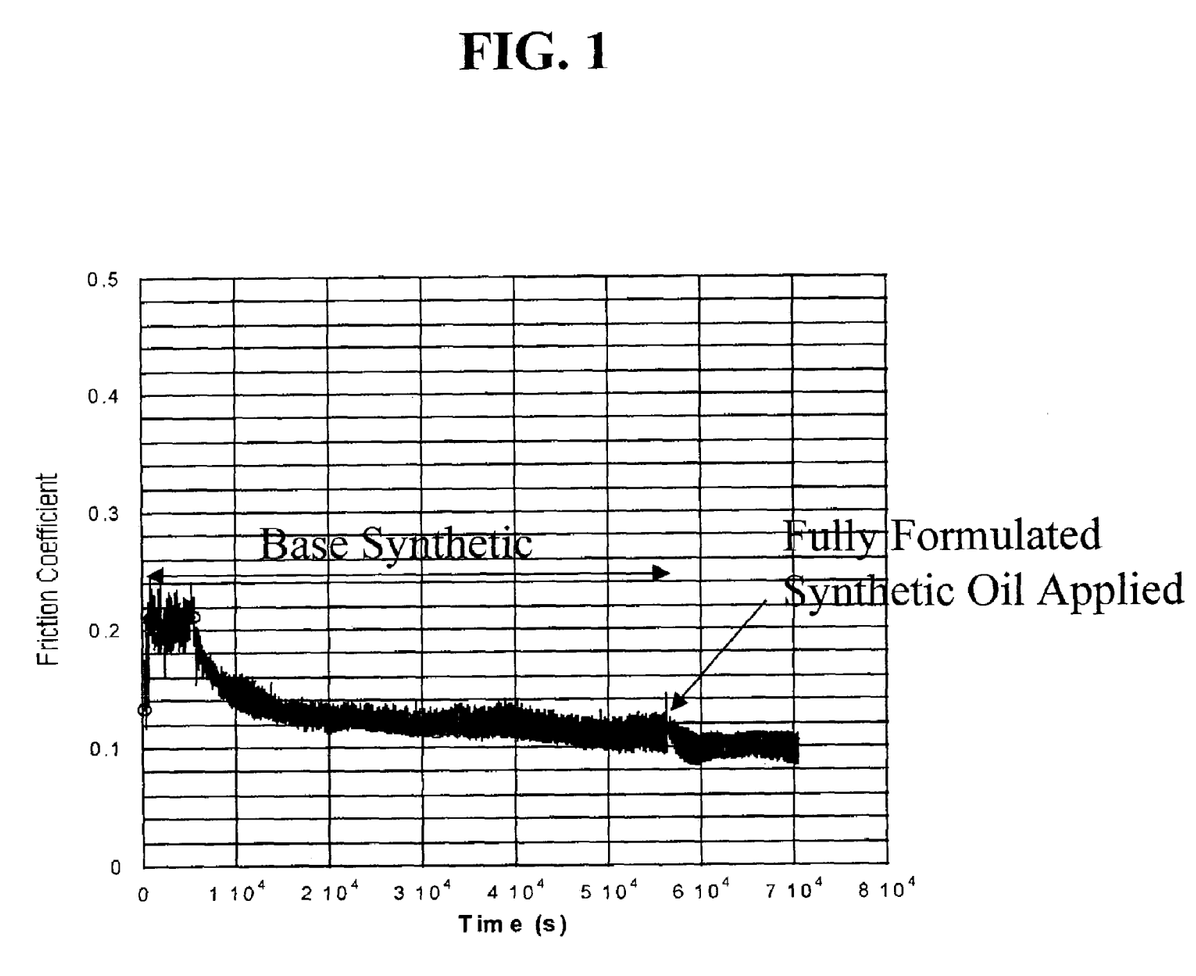
FIG. 1 is a plot showing the frictional performance of a TiN coating in base synthetic oil and fully formulated synthetic oil.
Figure 2A:
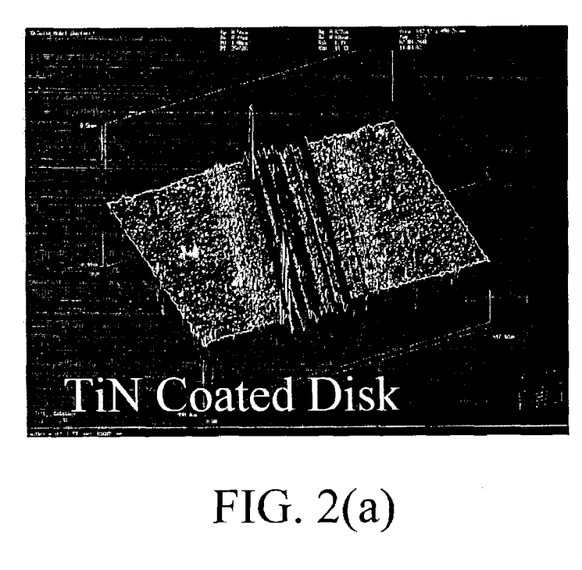
Figure 2B:
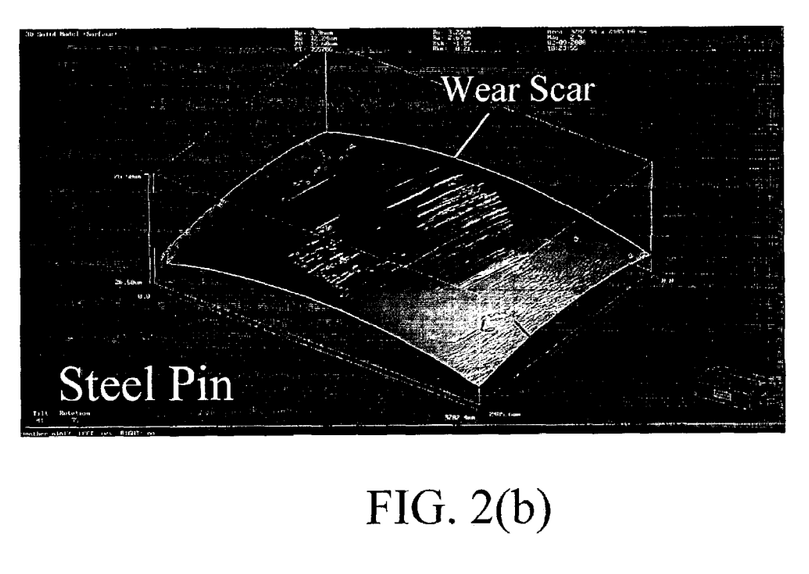

In FIG. 1, the frictional performance of a TiN coating, without the addition of an additional metallic substance, is shown in base synthetic oil and fully formulated synthetic oil. There is no appreciable difference in the friction between the base synthetic oil and the fully formulated synthetic oil. FIGS. 2(a) and 2(b) demonstrate that significant wear occurs on both the pin surface and the disk surface with a TiN coating in base oil.

Figure 3:
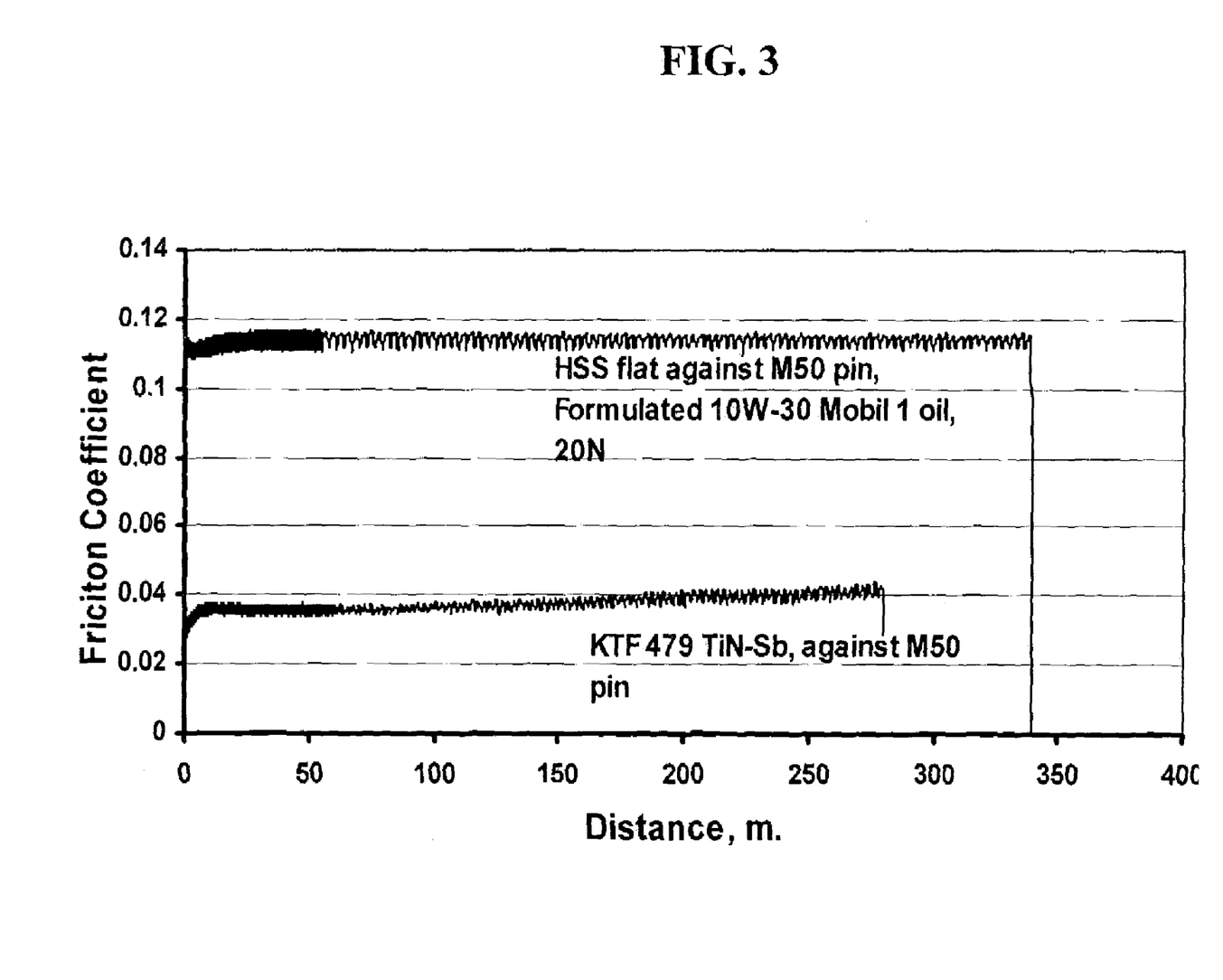
FIG. 3 is a plot comparing the friction behaviors of high-speed steel (HSS) and TiN—Sb coatings against a M50 pin in formulated 10W-30 Mobil 1 oil under a 20N normal load.
Figure 4:
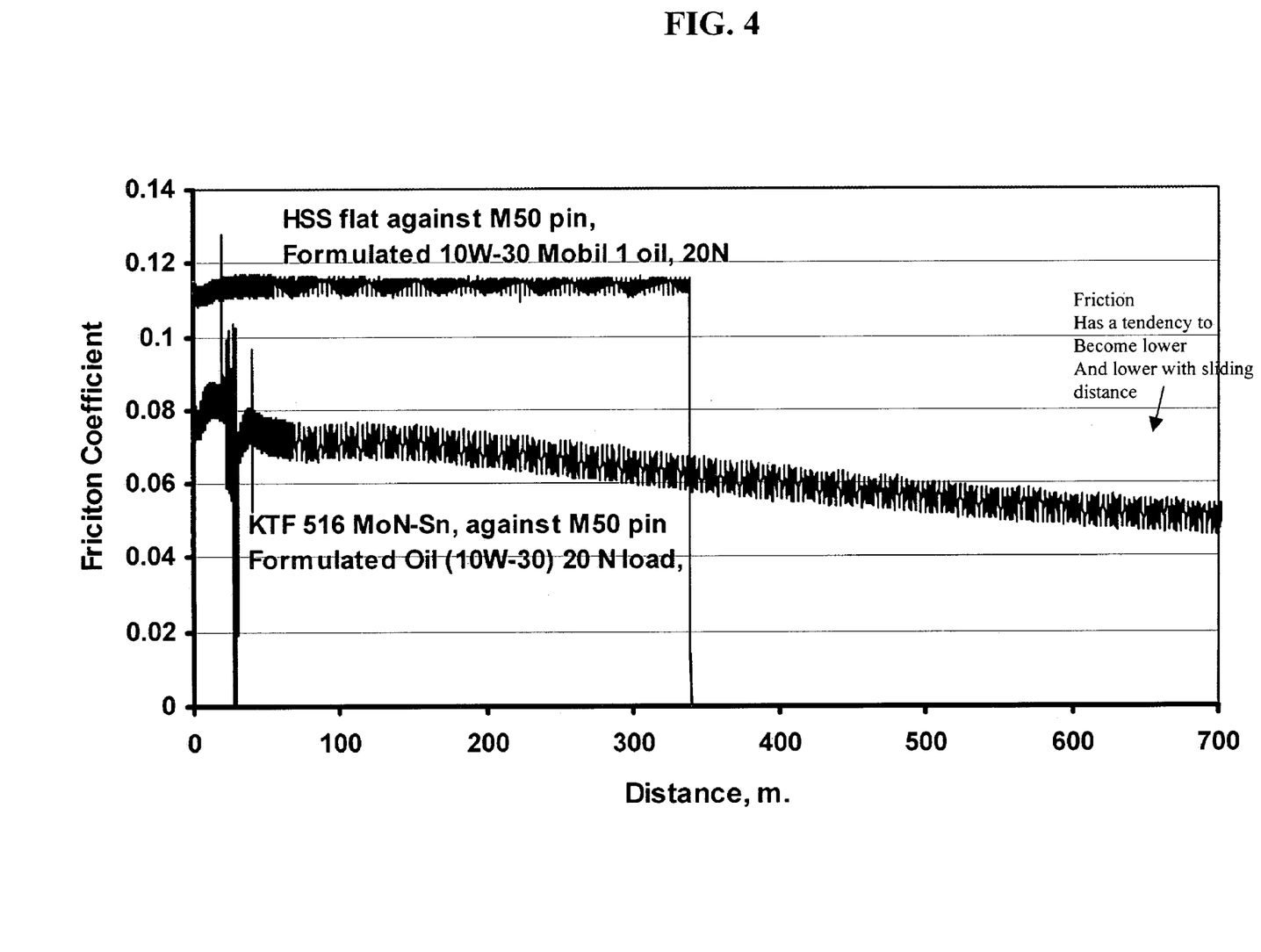
FIG. 4 is a plot comparing the friction behaviors of HSS and MoN—Sn coatings against a M50 pin in formulated 10W-30 Mobil 1 oil under a 20N normal load.
Figure 5:
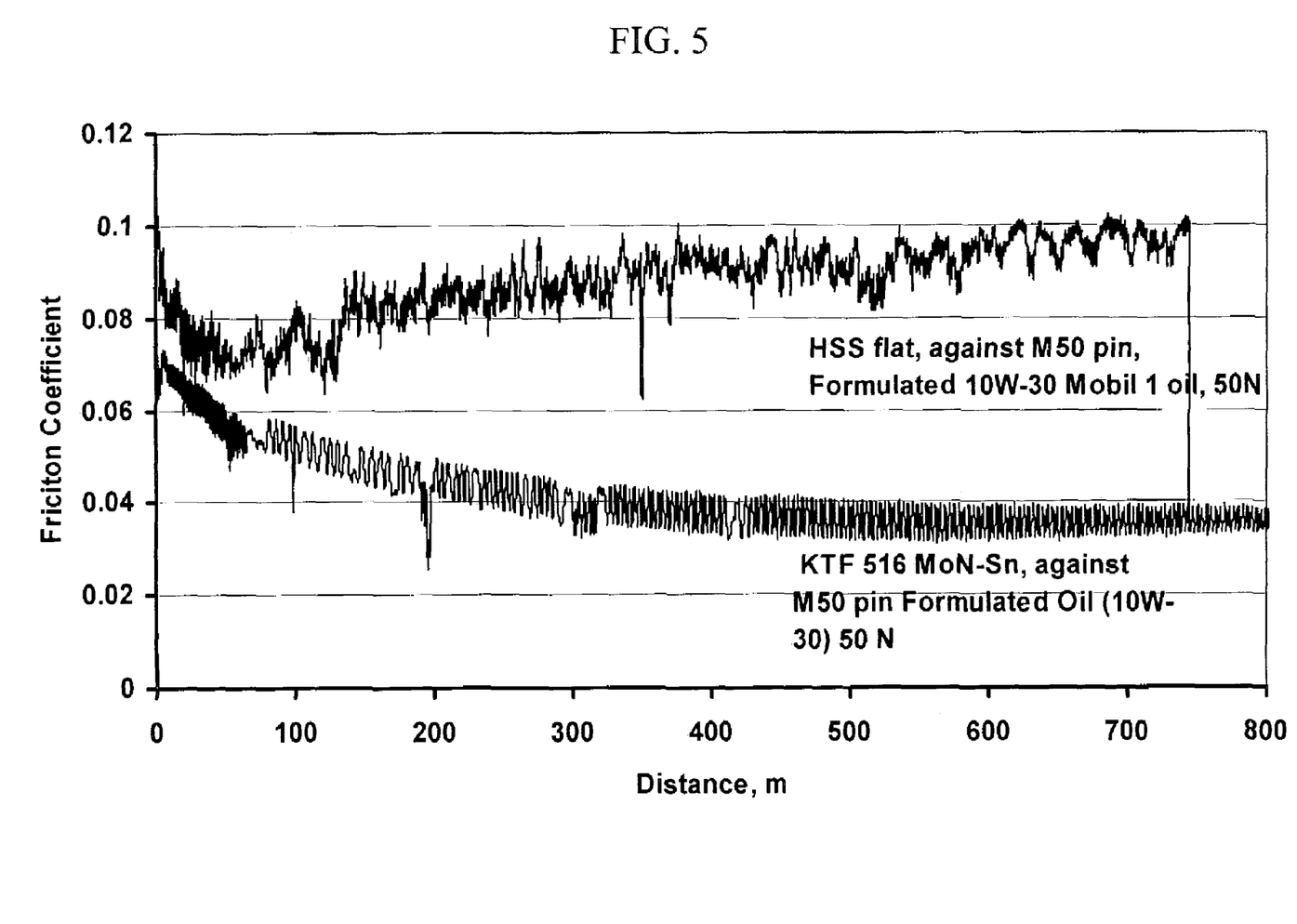
FIG. 5 is a plot comparing the friction behaviors of HSS and MoN—Sn coatings against a M50 pin in formulated 10W-30 Mobil 1 oil under a 50N normal load.

FIG. 3, however, demonstrates that when antimony is added to the same TiN coating, the friction coefficient drops to around 0.04, significantly lower than the friction coefficient for high speed steel (HSS). This comparison demonstrates the effectiveness of the antimony additive in reducing friction under boundary lubricated sliding conditions. Similarly, a coating system comprising MoN and tin results in a substantially decreased friction coefficient compared to high speed steel, as shown in FIGS. 4–5. The data in FIG. 4 represents a comparison of the friction behaviors for both MoN—Sn and HSS against M50 pin in formulated 10W-30 Mobil 1 oil under a normal load of 20N. In FIG. 5, where a normal load of 50N is applied, the frictional behavior becomes even more favorable with the inclusion of tin.

Figure 6:
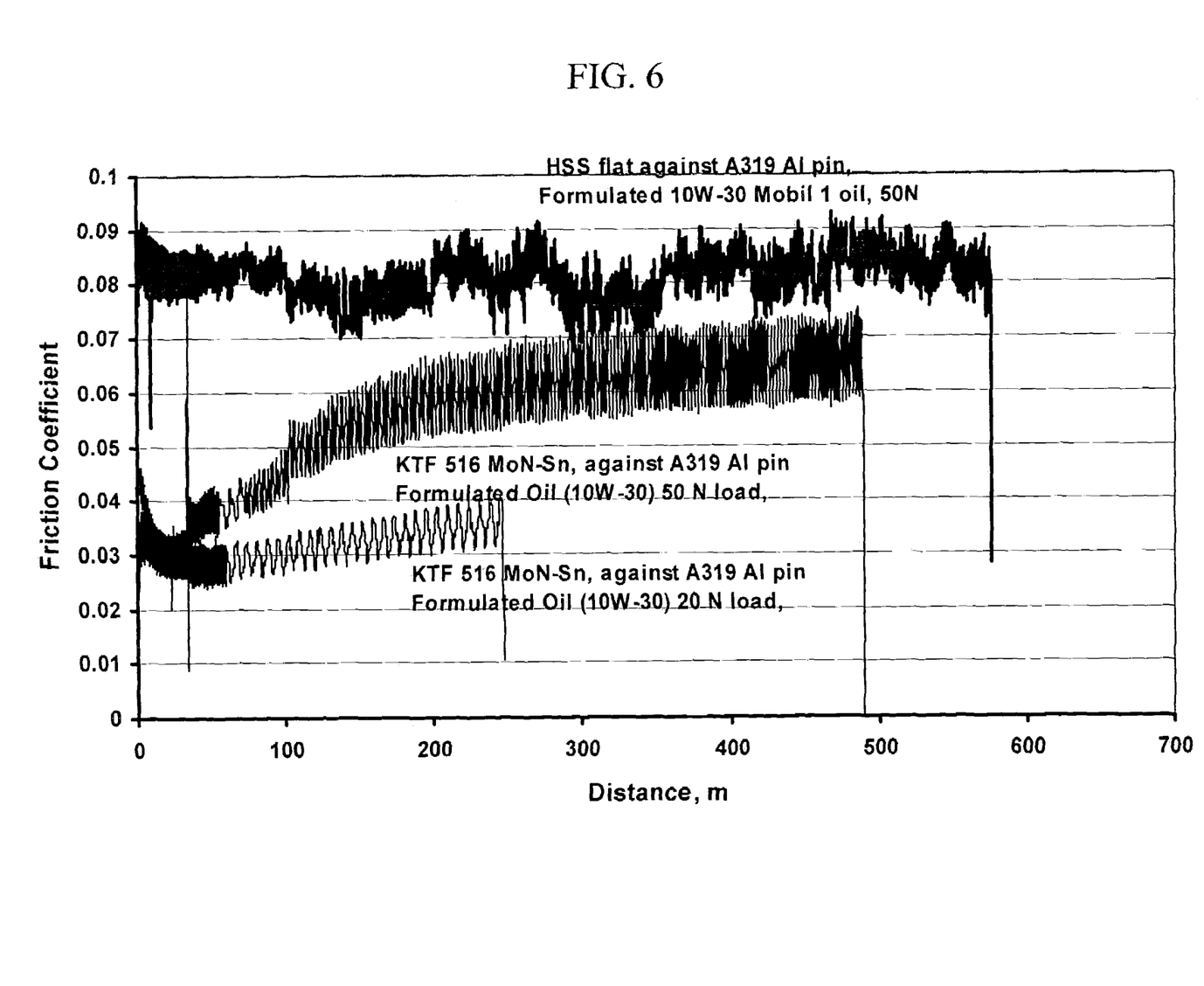
FIG. 6 is a plot comparing the friction behaviors of HSS and MoN—Sn coatings against A319 A1 pin in formulated 10W-30 Mobil 1 oil under 20N and 50N normal load.

The data in FIG. 6 demonstrates that the use of nano-alloyed coatings can also be beneficial in the case of aluminum based alloys. In FIG. 6, the highest recorded friction coefficient with an A319 aluminum pin is registered for high speed steel with a 50N load, while the friction coefficients for a MoN—Sn coating are significantly lower for both 20N and 50N loads.

Figure 7:
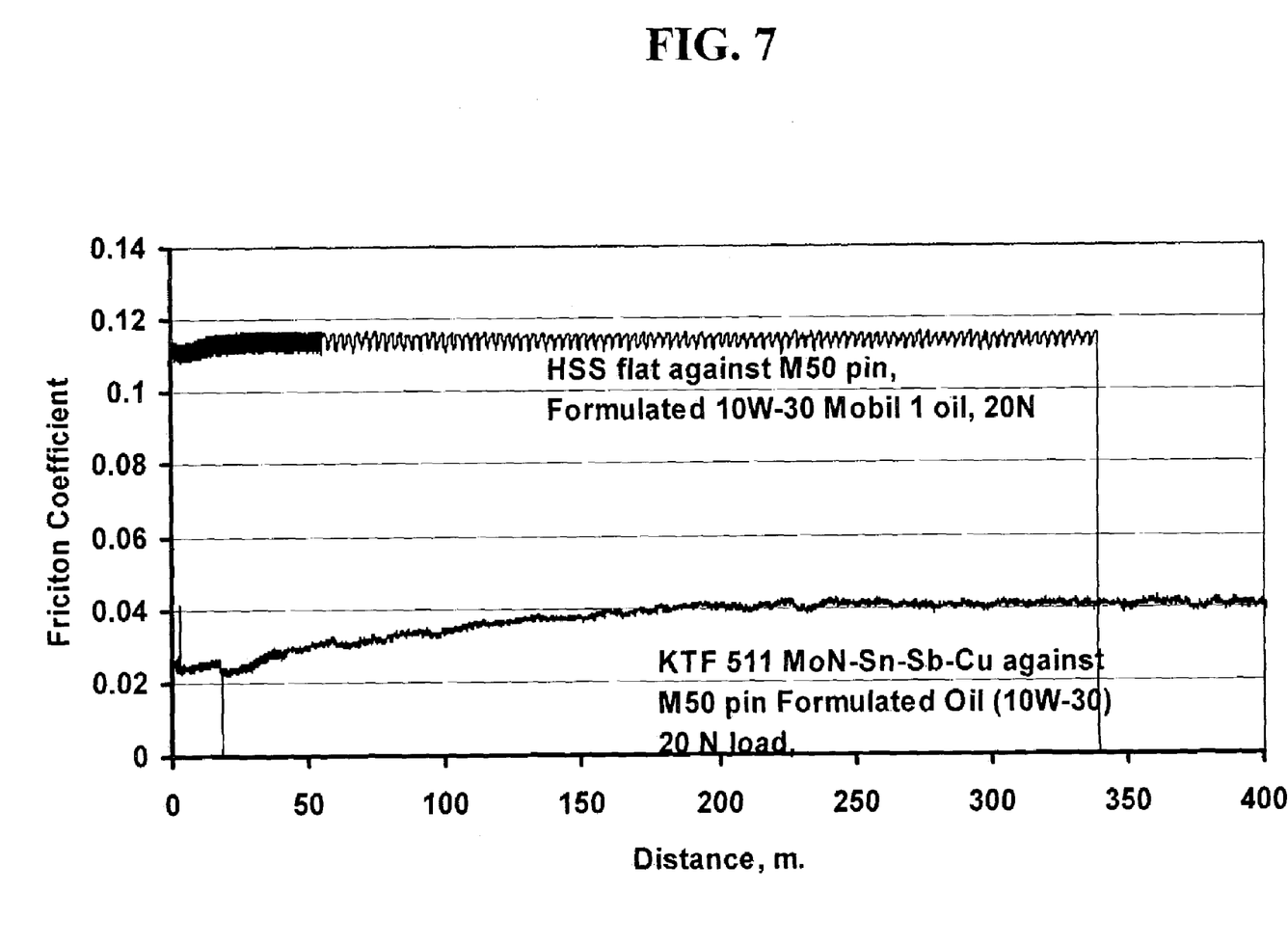
FIG. 7 is a plot comparing the frictional behaviors of HSS and MoN—Sn—Sb—Cu coatings against a M50 pin and formulated 10W30 Mobil 1 oil under a 20N normal load.

FIG. 7 shows the improved properties of a MoN coating system that also includes an alloy of tin, antimony and copper, also known as a babbit alloy. For the coating tested in FIG. 7, the metallic coating target comprises a composition of 7 wt. % antimony, 5 wt. % copper and 88 wt. % tin. When this coating is tested against M50 pin in formulated 10W-30 Mobil 1 oil under a normal load of 20N, the resulting friction coefficient was approximately 0.04. In comparison, high speed steel tested under identical conditions results in a friction of about 0.115, almost three times larger than the coefficient for the MoN—Sn—Sb—Cu coating.

Figure 8:
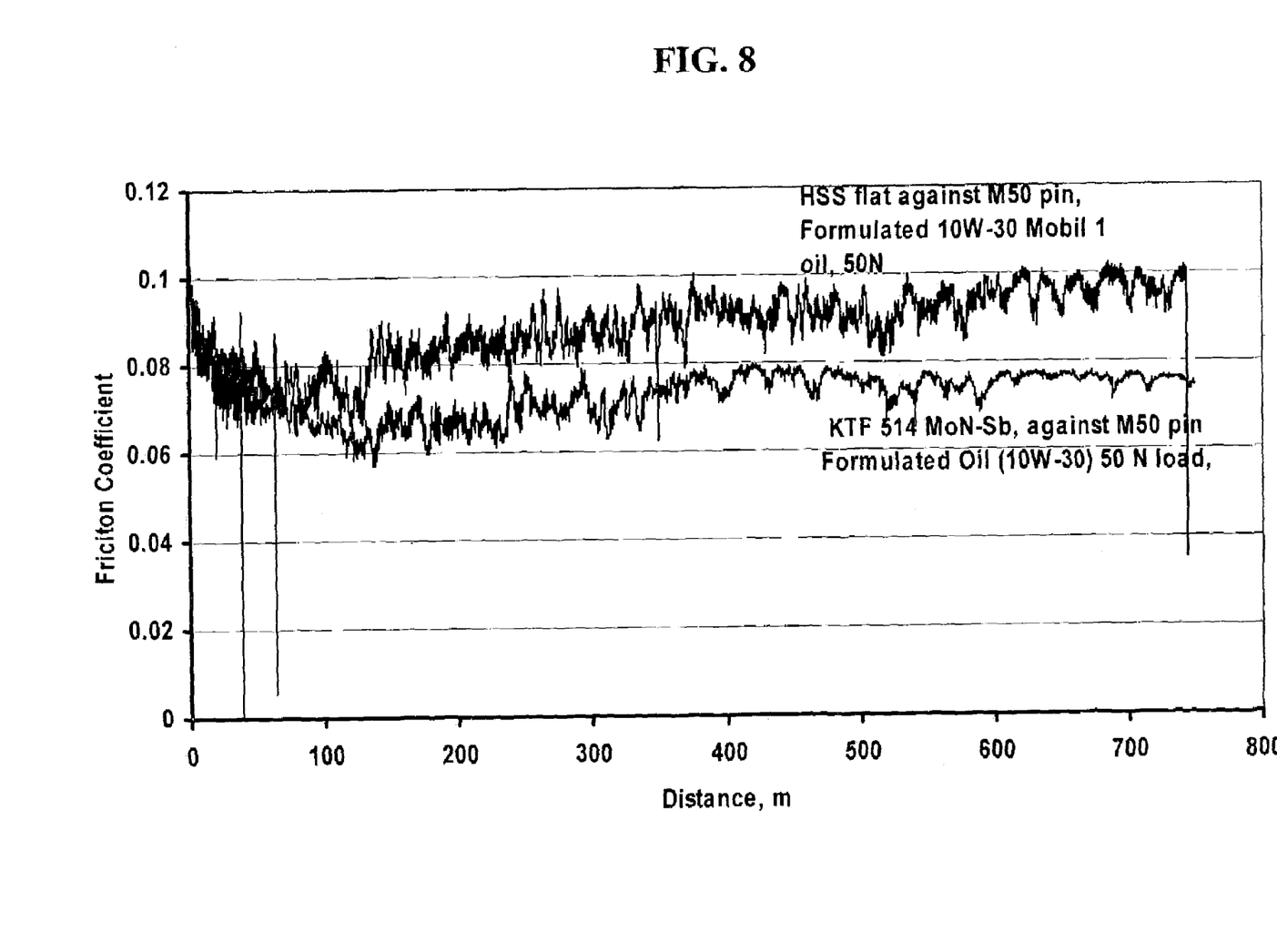
FIG. 8 is a plot comparing the friction behaviors of HSS and MoN—Sb coatings against a M50 pin in formulated 10W30 Mobil 1 oil under a 50N normal load.
Figure 9:
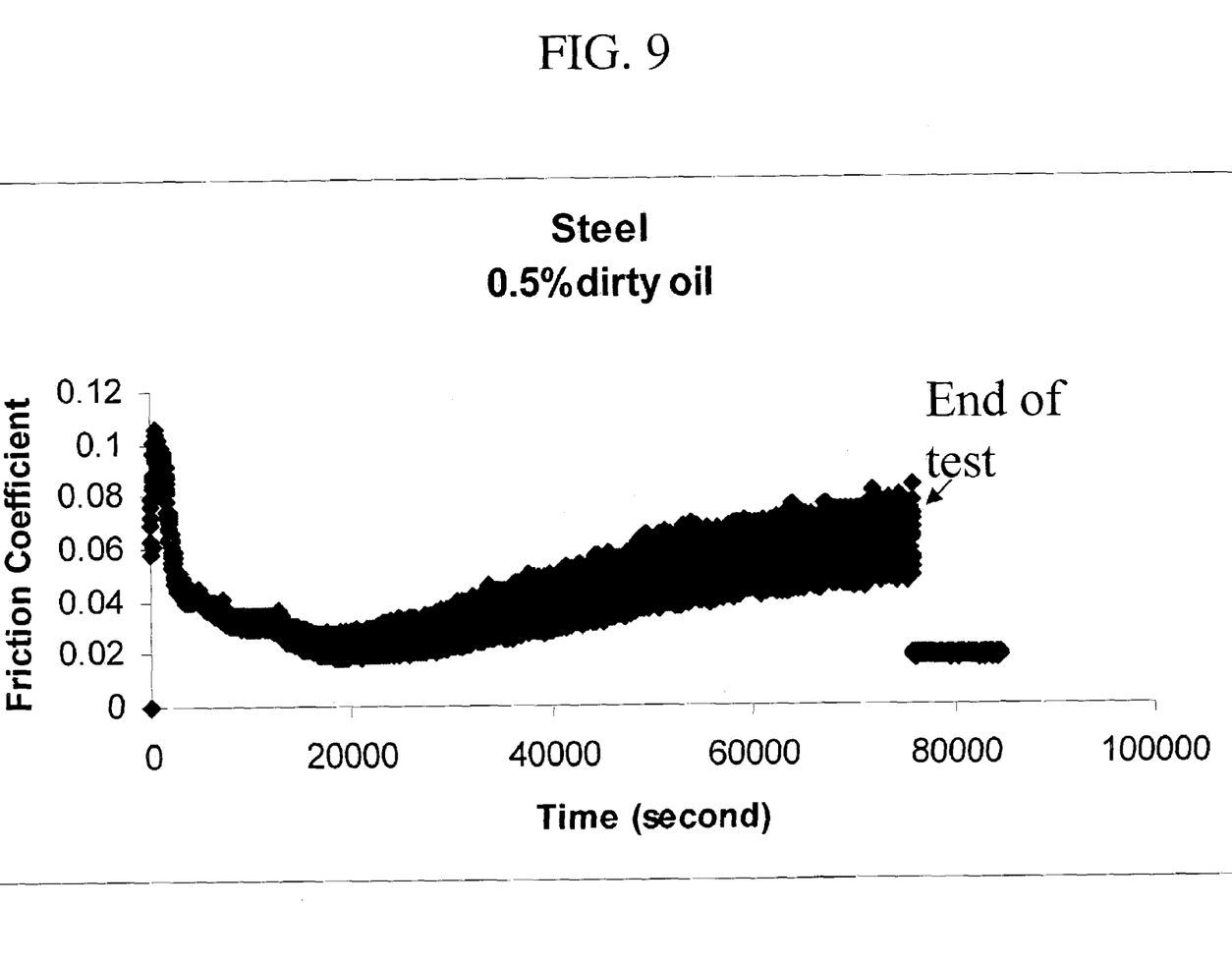
FIG. 9 is a plot showing the friction coefficient for steel in a dirty oil solution containing 0.5% $H_2SO_4$.

FIG. 8 shows a comparison of the friction behaviors of high speed steel versus a MoN—Sb coating against M50 pin in formulated 10W-30 Mobil 1 oil under a normal load of 50N. Although the effect of antimony on reducing the friction of MoN is not as dramatic as that with TiN, the friction coefficient is still lowered relative to high speed steel. In the example shown in FIG. 8, the level of antimony was not optimized, potentially causing the lack of substantial improvement.

Figure 10A:
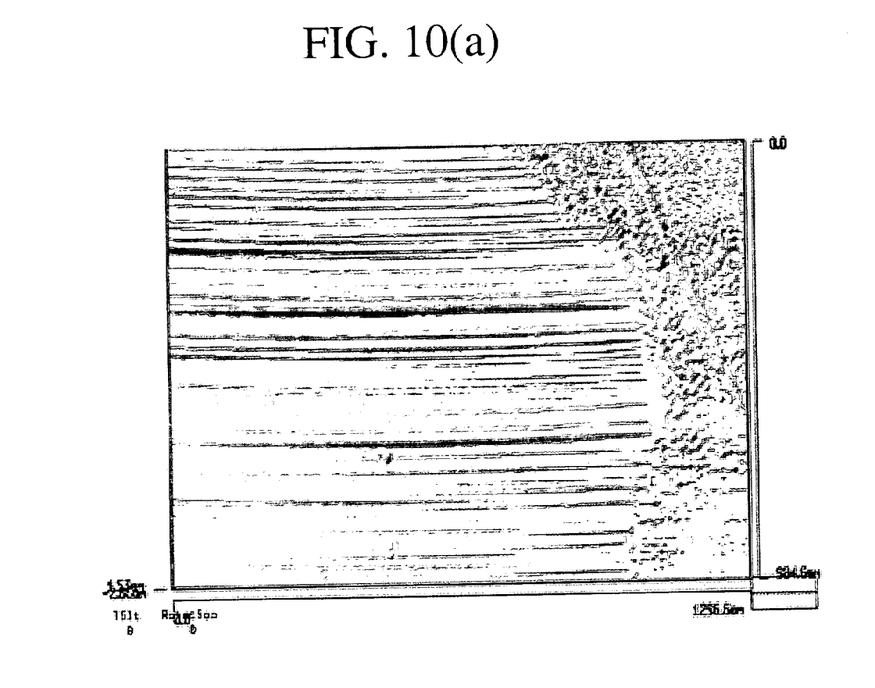
Figure 10B:
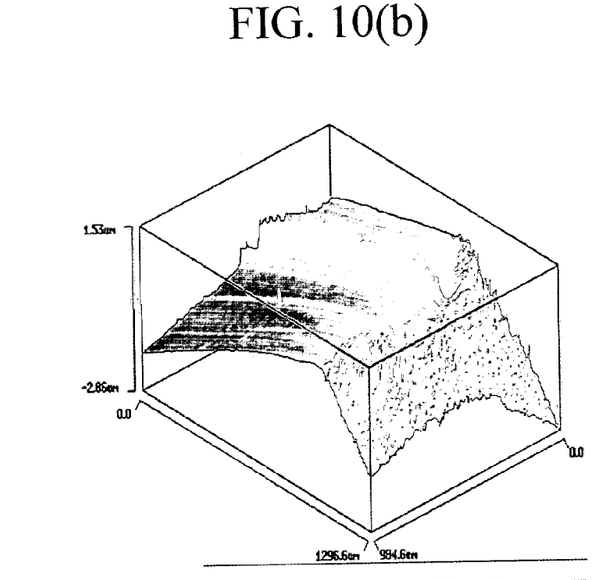
Figure 10C:
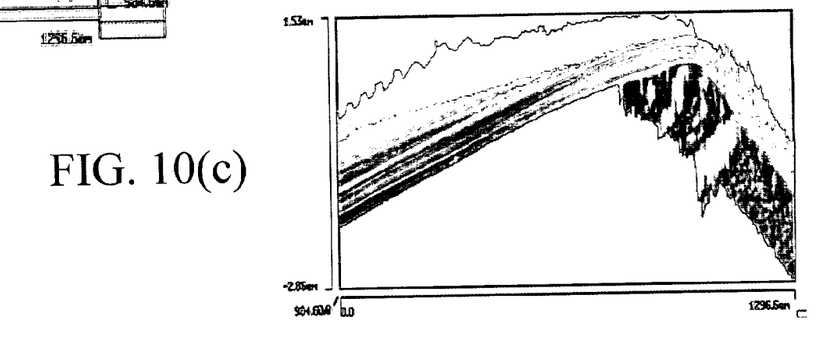

Furthermore, it has been determined that the friction coefficient for the new coatings of the present invention also improves in $H_2SO_4$-containing "dirty" oil. As shown in FIG. 10, a test on a steel pin and disk in 0.5% $H_2SO_4$-containing dirty oil shows that the friction level starts relatively high, initially decreases during sliding, and then steadily increases over time, becoming extremely unstable. FIGS. 10(a)–10(c) show the severe wear that results from such a test.

Coatings developed in accordance with the present invention could be highly beneficial when used with a variety of components which typically undergo a large amount of wear. For example, engine wear parts, such as valve seats, gears, fuel injectors, piston rings and cylinder liners could be significantly improved with coatings according to the present invention. In the transportation field, potential key benefits for components incorporating the present invention include extended wear life, lower maintenance cost and higher reliability in advanced engines that operate under increasingly harsh conditions. The coatings of the present invention may also increase energy efficiency by decreasing frictional losses between sliding engine parts and components such as piston rings and cylinder liners. The coatings can also reduce environmental emissions by allowing higher radial loadings on top compression rings that regulate blow-bys and oil leakage to combustion chambers.

Other potential applications in transportation sector include piston rings and cylinder liners, fuel injectors, gears, rolling and sliding bearings, pump seals, valves and valve seats, tappets, and many other parts that subjected to severe friction and wear situations. These super hard coatings can be deposited on steel and cast iron substrates at moderate temperatures (i.e., 200–400° C.) and at high growth rates using, for example, conventional cathodic arc discharge, ion-plating, unbalanced magnetron sputtering, and laser ablation methods. The present invention may also have large impact on metal-cutting and forming industries where dry or marginally lubricated machining/forming of steel and other metals may be feasible.

While several embodiments have been shown and described in this application, it is understood that changes and modifications can be made to the invention without departing from the invention's broader aspects. For example, metals such as zinc or platinum could be used in as alloying ingredients for the nitride coating. Therefore, the present invention is not limited to the described and illustrated embodiments, but only by the scope and spirit of the independent and dependent claims.

The invention claimed is:

1. An improved coating material having improved lubrication and hardness properties, comprising:
   a hard nitride coating having nanocrystalline grains of size from about 10–100 nm; and
   a soft metal homogeneously distributed within the hard nitride coating in the form of a nanocrystalline size film of a few atomic layers thickness coating the nanocrystalline hard nitride grains and the soft metal ranging between about 0.2–20 wt. percent, the soft metal thereby combining with the hard nitride coating to form a nanostructured, nanocomposite film,
   wherein the soft metal comprises a component selected from the group consisting of tin, antimony, bismuth, silver, indium, platinum gold and alloys thereof.

2. The coating material of claim 1, wherein the soft metal comprises alloys of tin, Bi, In, Sb, Pt, and Au.

3. The coating material of claim 1, wherein the soft metal comprises a vapor deposited form of the nanocrystalline size film.

4. The coating material of claim 3, wherein the soft metal comprises a component selected from the group consisting of Au, Sb, Pt, Sn, In and Bi having an atomic concentration between about 0.2–25%.

5. The coating material of claim 1, wherein the hard nitride coating comprises molybdenum nitride.

6. The coating material of claim 5, wherein the hard nitride coating comprises ÿ-MoN.

7. The coating material of claim 5, wherein the hard nitride coating comprises ÿMo$_2$N.

8. The coating material of claim 1, wherein the hard nitride coating comprises molybdenum nitride and wherein tin, indium and antimony are homogenously distributed within the molybdenum nitride.

9. The coating material of claim 1, wherein the hard nitride coating comprises titanium nitride.

10. The coating material of claim 9, wherein the soft metal comprises antimony.

11. The coating material of claim 1, wherein the hard nitride comprises chromium nitride.

12. An improved coating material having improved lubrication and hardness properties, comprising:
    about 98.8 to 80.0 weight percent of a hard nitride coating;
    about 0.2 to 20.0 weight percent of soft metal homogeneously distributed within the hard nitride coating, the soft metal combining with the hard nitride coating to form a film; and
    the film comprising nanocrystalline structures of about 10 nm to about 50 nm;
    wherein the soft metal comprises a component selected from the group consisting of tin, antimony, silver, indium, gold, platinum, zinc and alloys combinations thereof.

* * * * *